United States Patent [19]
Southworth

[11] 3,812,388
[45] May 21, 1974

[54] SYNCHRONIZED STATIC MOSFET LATCH

[75] Inventor: Richard Alvin Southworth, Austin, Tex.

[73] Assignee: International Business Machines Corporation, Armonk, N.Y.

[22] Filed: Sept. 28, 1972

[21] Appl. No.: 293,191

[52] U.S. Cl. .......... 307/291, 307/208, 307/221 C, 307/238, 307/247
[51] Int. Cl. .......... H03k 3/286
[58] Field of Search ........ 307/205, 208, 213, 221 C, 307/238, 279, 304, 291

[56] References Cited
UNITED STATES PATENTS 3,648,072 3/1972 Harper .......... 307/291 X
3,560,764 2/1971 McDowell .......... 307/279 X

*Primary Examiner*—John Zazworsky
*Attorney, Agent, or Firm*—John L. Jackson

[57] ABSTRACT

A hybrid master/slave device latch including a dynamic input stage is operable under a two-phase clock and set and reset inputs to set or reset a static output stage. If a latch is implemented in MOSFET logic to operate in the purely dynamic mode and the latch is not refreshed at, for instance, the rate of 10 kHz, a malfunction may occur due to the leakage of charges from temporary storage capacitors. With this dynamic type of latch, due to the relatively high refresh frequencies required, extreme difficulty is encountered in testing. While a static type of device can be operated at extremely low or zero frequencies and thus can be readily tested, it requires more MOSFET devices. The subject invention combines the attributes of the fewer number of components required in a dynamic latch with the memory ability of a static latch in a particular implementation such that there are fewer MOSFET devices required than would be required in either a purely static or dynamic latch.

4 Claims, 5 Drawing Figures

SYNCHRONIZED STATIC MOSFET LATCH

BACKGROUND OF THE INVENTION

1. Field of the Invention

This invention relates in general to master/slave devices such as flip-flops or latches which can be used in implementing counters, shift registers, sequential logical circuits, etc., in general, and more particular to a master/slave latch which utilizes a combination of a dynamic input stage along with a static output stage.

2. Description of the Prior Art

Two-phase master/slave devices which hereinafter will be referred, for purposes of convenience as latches, have normally in the prior art been either of the wholly static type or of the dynamic type when implemented in MOSFET logic. Advantages associated with implementation in the dynamic mode are that a fewer number of MOSFET devices are required. As above noted, however, the prime disadvantage associated with this type of latch is that it is extremely difficult to test due to the required high refresh frequencies which are necessary to keep it from dying.

With respect to static type latches implemented in MOSFET technology, while they need not be refreshed and thus can be readily tested, they are however, relatively expensive in terms of space on a MOSFET chip due to the relatively large number of MOSFET devices required as compared to a dynamic latch. Consequently, there has in the past been a trade-off made between the desirability of accurate testing and the cost of the device itself.

Another problem associated with the static type of two-phase device implemented in MOSFET logic is that in a typical master/slave logical combination, normally, there will be a master/slave or latch device, which drives a number of intermediate logic blocks, which provide an output to another latch or master/slave element. Thus, quite often the propagation through the intermediate devices will cause the receiving latch to be erroneously set if the conditions are just right at either of the clock times. This problem is not found or associated with MOSFET devices which are operated in the dynamic mode since the capacitors associated with the devices act as integrators and thus prevent a false setting of the devices.

From the above, it can be seen that it is desirable that a latch be provided which has all of the attributes of a dynamic device, i.e., extremely few components along with an unsusceptibility to erroneous setting and having the memory feature associated with the static type of MOSFET latch.

SUMMARY OF THE INVENTION

In summary, there is provided a hybrid dynamic and static MOSFET latch which is operable with only two-clock pulses, phase one ($\phi_1$) and phase two ($\phi_2$). The input stage to the latch is dynamic with the set or reset condition being stored at phase one time on either a set or reset capacitor and the charge on the capacitor at phase two time then utilized to control associated MOSFET devices to set a cross-coupled NOR pair in accordance with whether the input was set or reset. This cross-coupled NOR pair stores the input until a different set or reset input occurs at phase one time.

DESCRIPTION OF THE PREFERRED EMBODIMENT

Figure 5:
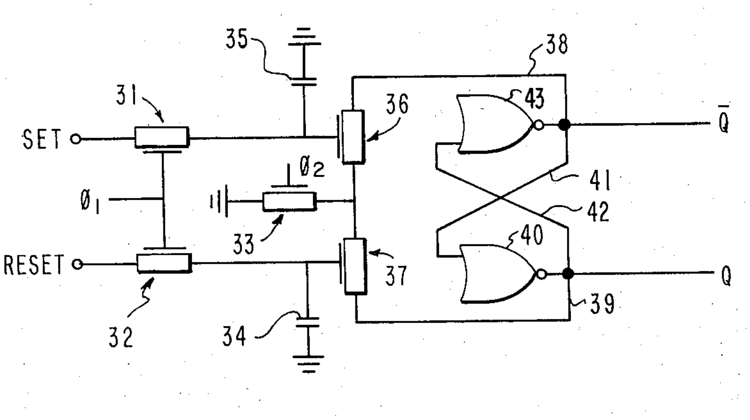
FIG. 5 illustrates the latch which is the subject of the present invention which utilizes both dynamic and static sections.

Prior to describing the latch of FIG. 5, which is the subject of the present invention, a brief description of prior art latches will be presented.

In the following description, reference will be made to high logical levels and low logical levels. These values will, of course, depend upon the particular MOSFET device being utilized. However, for purposes of illustration, it will be assumed that a low logical level is ground or zero, and a high logical level is a positive voltage; such as, 8 volts. In addition, while the term MOSFET is used, it should be understood that this term is intended to be generic to any Field Effect Transistor or voltage switching device.

Figure 1:
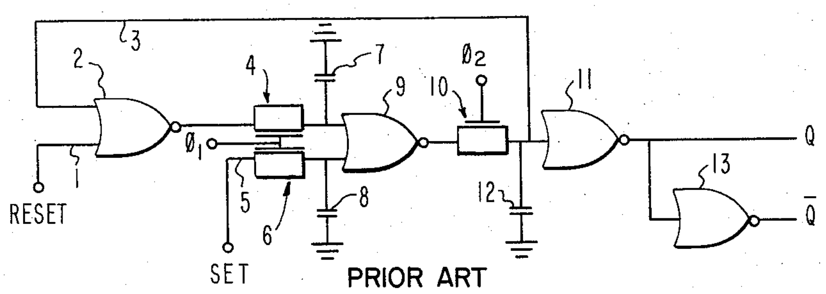
In FIG. 1 is shown a conventional dynamic latch implemented in MOSFET technology.
Figure 3:
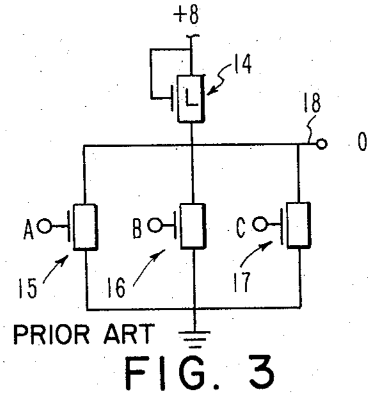
FIG. 3 is illustrative of a typical NOR circuit implemented in MOSFET technology to illustrate the number of MOSFET devices required.

In FIG. 1 is shown a typical dynamic latch implemented in MOSFET technology. As shown, there are a number of NOR circuits 2, 9, 11 and 13 connected to provide a Q (reset) or Q (set) function. To aid in an understanding of the NOR devices, refer to FIG. 3 wherein there is shown a typical implementation of a NOR device in MOSFET technology. This is a generalized NOR device. FET 14 is the load device; the other three devices, 15, 16 and 17 are the input devices to the NOR circuit. Any one of the devices 15, 16 or 17 can pull line 18 to ground or to the zero state when it is turned on by application of a positive logical level to its input A, B or C. Device 14 (the load device) causes the output on line 18 to go high in the absence of any logical one or high logical level being applied to devices 15, 16 or 17. Thus, from a consideration of FIG. 3, it can be seen that the number of MOSFET devices in a NOR circuit implemented in MOSFET technology, which is required, is equal to the number of inputs plus one. Thus, in FIG. 4, four MOSFET devices are required for this NOR circuit. The significance of this fact will become apparent in the latter description, wherein the number of MOSFET devices required for implementation of the various latches is compared.

Figure 2:
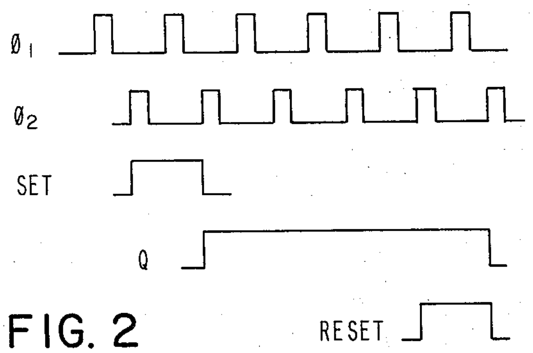
FIG. 2 shows the timing diagrams associated with the latches of FIGS. 1 and 5 and these diagrams in inverted form represent the timing required for the latch illustrated in FIG. 4.

Refer again to FIG. 1 wherein a high logical level is applied along line 5 which is the set line of the latch. This high logical level, as illustrated by the timing diagram of FIG. 2, is at phase one time stored across capacitor 8. This causes the output of NOR 9 to go low; however, this low level is blocked from being input to NOR 11 by FET 10 since phase two time has not occurred. During phase one time, the output from NOR circuit 11 which is labelled Q is, therefore, at a high logical level due to the operation of its load FET device. At phase two time, device 10 conducts and transfers the output of NOR circuit 9 to temporary holding capacitor 12. Thus, at phase two time a low logical level is stored on capacitor 12 and, therefore, the output from NOR circuit 11 labelled Q goes high to satisfy the set condition. The output from NOR circuit 13 which is the inverse of that output from NOR circuit 11 is, therefore, low. The low logical level on capacitor 12 is fed back along line 3 which causes the output of NOR 2 to be high. At the next phase one time this positive input will be stored across capacitor 7 and the sequence described through NOR 9, FET 10, etc., will be the same as previously described until a reset pulse is applied to reset line 1.

Upon reset, NOR circuit 2 inverts the high reset level applied along line 1 causing a low logical level to be stored across capacitor 7 through FET 4 at phase one time. At this time, the output of NOR 9 is, therefore, high and when phase two occurs a positive logical level will be stored on or across capacitor 12. Therefore, the Q output will go low and Q output will go high. Thus, the reset condition is met. The latch back is again along line 3 to NOR 2 and the latch will remain in this reset state until a set input is received. This above description, taken with the timing diagram, is illustrative of the operation of a normal dynamic MOSFET latch. It will be noted that to implement this latch to operate in a set and reset manner with two clocks, $\phi_1$ and $\phi_2$ that 13 MOSFET devices are required. Three in NOR 3, two for $\phi_1$, three for NOR 9, one for $\phi_2$, two for NOR 11 and two for NOR 13.

Figure 4:
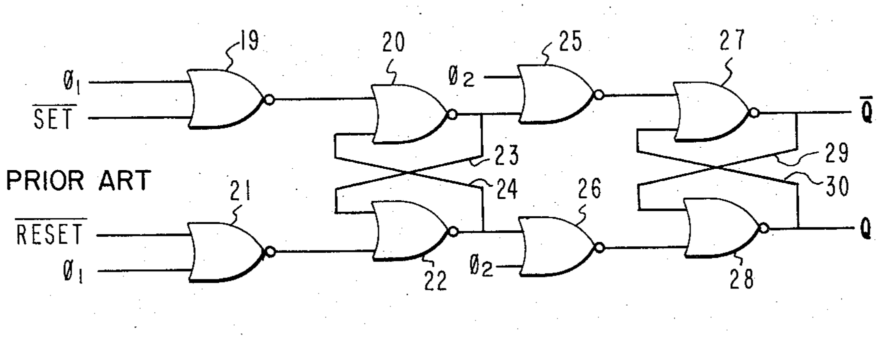
FIG. 4 illustrates a static MOSFET latch.

Refer next to FIG. 4 wherein is shown a typical cross-coupled static MOSFET latch. As illustrated in FIG. 4, the set and reset conditions require negative logical levels and, also, the clock pulse are negative. That is, the timing diagram for this latch is that of FIG. 2, inverted. First, the setting of the latch will be described. It will be noted during the following description that the required condition is propagated from a first cross-coupled pair of NOR circuits 20 and 22 wherein it has been set at phase one time into an output cross-coupled pair of NOR circuits 27 and 28 at phase two time. At phase one time, assuming that a set condition is applied which as above indicated is a zero logical level, the output of NOR 19 will be at a high logical level thus, causing NOR 20 to output a low logical level which is fed along line 23 to NOR 22. At the same time, considering the lower portion of FIG. 4, since the set condition is at a zero logical level, the reset line into NOR 21 will be at a positive logical level and, therefore, the output of NOR 21 will be at a low logical level thus, causing the output of NOR 22 to go positive due to the two low logical level inputs. Since there are two zeros or low logical levels applied to NOR circuit 22, its output will be positive and this output is cross-coupled along line 24 and applied as the other input to NOR 20 to complete the latch up. Upon the rise of the phase one pulse, the low logical level at the output of NOR 20 does not change since it still receives a positive input along line 24 from latch 22. At phase two time two low logical levels will be applied to NOR 25 and its output, therefore, will go positive and due to this positive input into NOR 27, the output of NOR 27 will go to a zero logical level. This zero logical level is cross-coupled along line 29 and is input into NOR circuit 28. At the same time, there is a low logical level applied to NOR 28 from NOR 26, since there is a positive logical level output from NOR circuit 22. The two low logical levels applied to NOR circuit 28 cause its output to be at a positive logical level and this positive level is applied or cross-coupled along line 30 to provide the other input to NOR 27 to complete the latch up with a zero logical level at the output of NOR circuit 27 and a positive logical level at the output of NOR 28. The reset operation will not be described since the circuit is symmetrical and it operates in actually the same manner with the reset logical level going to zero to provide a reversal of the outputs from NOR's 20 and 22 and the final outputs from NOR's 27 and 28. As will be noted, to implement this static latch or flip-flop with MOSFET technology, each of the NOR circuits which number eight, require two inputs plus the load, which therefore dictates that a total of 24 MOSFET devices be used.

In FIG. 5 there is shown the present invention which incorporates all of the desirable features of dynamic and static shift registers, i.e., unsusceptibility to stray propagation pulses along with the requirement of a fewer number of MOSFET devices and the memory feature of the static latch. As above indicated, the novel circuit of FIG. 5 provides these desirable features with fewer MOSFET devices required than was required for either of the previously two described dynamic and static latches. That is, prior to a discussion of the subject novel circuit of FIG. 5, it can be seen that only nine MOSFET devices are required; two for $\phi_1$; three for $\phi_2$ and two each for NOR's 40 and 43. This nine device latch thus compares quite favorably with the 13 required for the dynamic latch of FIG. 1 and 24 required for the static latch of FIG. 4.

Referring still to FIG. 5, a set input is applied to device 31 at phase one time. This high logical level is stored on capacitor 35. At phase two time, device 33 is turned on and a conductive path is set up to discharge capacitor 35 through device 36 and device 33 causing line 38 to go to ground or a low logical level. Thus, the Q output of NOR 43 is at a low logical level at the set time. The output line of NOR device 43 is cross-coupled by means of line 41 to provide a low logical level input to NOR 40. This low logical level input, therefore, causes the output of NOR 40 which is Q to rise to a positive logical level representing the set condition. This is accordance with the description of FIG. 3, wherein it was shown that if a MOSFET NOR circuit does not have a positive input, its output will be high. The circuit latches up at this time, since the output of NOR 40 is cross-coupled along line 42 to NOR 43. This positive logical level applied to NOR 43 causes the low logical level to be held at the output of NOR 43. The circuit is symmetrical and the exact opposite operation or sequence takes place during reset.

During reset at phase one time, a positive logical level, which is applied to the reset line connected to device 32 is stored across capacitor 34 and at phase two time, a conductive path is set up through coupling or isolation devices 37 and 33 to ground, thus causing line 39 to go low. Thus, the Q output from NOR 40 is at this time low and this low logical level is applied along line 42 to the input of NOR 43 which allows its output which is Q to go high. The latch is made by the cross coupling of the positive logical level along line 41 to the input line of NOR 40 which causes its output to remain at a low logical level.

While it is recognized that for purposes of reliability the temporary storage means should be capacitors, if the clock times are of high enough frequency that they may be eliminated and the inherent stray capacitance of the input stage relied on.

Thus, as illustrated, the input portion of the device operates in the dynamic mode while the output portion of the device operates in the static mode and, therefore, no refreshing is required as in the case of the dynamic latch of FIG. 1 since the capacitors 34 and 35 need only hold their charges during the period between when phase one falls and phase two rises. In addition since the capacitors 35 and 34 are in effect integrators, it makes no difference whether the positive logical levels applied to the set and reset lines from other components in the system are stable during the set and reset times. This is unlike the case of the static shift register of FIG. 4 in which a false condition could be set into the register if an erroneous spike occurs during the set or reset time.

In summary, there has been provided a novel hybrid latch which employs a dynamic input section and a static output section which does not need to be refreshed since the output is static and, therefore, the device can be tested by conventional techniques. In addition, fewer components are required for the latch than are required for either the dynamic latch of FIG. 1 or the static latch of FIG. 4. That is, 13 MOSFET devices are required for the dynamic device illustrated in FIG. 1 and 24 are required to implement the static latch of FIG. 4 while only nine devices are required for the device of FIG. 5.

While the invention has been particularly shown and described with reference to a particular embodiment, it will be understood by those skilled in the art that various changes in form and detail may be made without departing from the spirit and scope of the invention.

What is claimed is:

1. A two-phase master/slave device for providing set or reset outputs at phase two time at an output stage depending on whether a set or reset input is applied to the input stage of the device at phase one time comprising:

a. a dynamic input stage responsive to a phase one clock pulse including a temporary set storage means and a temporary reset storage means and means for charging one of said storage means in accordance with whether a set or reset input is applied to said stage, b. a static output stage which is set into a set or reset condition depending on the conditioning of said dynamic stage, and c. a switching means responsive to a phase two clock pulse for applying the conditioning of said dynamic stage to said static output stage.

2. The master/slave device of claim 1 further wherein said temporary storage means are the inherent stray capacitance in said dynamic input stage.

3. The master/slave device of claim 1 further wherein said temporary storage means are capacitors.

4. The master/slave device of claim 3 further wherein said set and reset signals do not overlap and are gated to charge their said associated temporary storage capacitors by application of a signal at phase one time to associated set and reset field effect transistors.

* * * * *